United States Patent
Schmidt et al.

(10) Patent No.: US 8,728,588 B2
(45) Date of Patent: May 20, 2014

(54) METHOD OF TREATING A SURFACE OF AT LEAST ONE PART BY MEANS OF INDIVIDUAL SOURCES OF AN ELECTRON CYCLOTRON RESONANCE PLASMA

(75) Inventors: Beat Schmidt, Montrond les Bains (FR); Christophe Heau, Saint Etienne (FR); Philippe Maurin-Perrier, St Marcellin en Forez (FR)

(73) Assignee: H.E.F., Andrezieux Boutheon (FR)

( * ) Notice: Subject to any disclaimer, the term of this patent is extended or adjusted under 35 U.S.C. 154(b) by 195 days.

(21) Appl. No.: 12/681,203

(22) PCT Filed: Oct. 9, 2008

(86) PCT No.: PCT/FR2008/051824
§ 371 (c)(1),
(2), (4) Date: Apr. 1, 2010

(87) PCT Pub. No.: WO2009/053614
PCT Pub. Date: Apr. 30, 2009

(65) Prior Publication Data
US 2010/0219160 A1     Sep. 2, 2010

(30) Foreign Application Priority Data

Oct. 16, 2007  (FR) ...................................... 07 58368

(51) Int. Cl.
*C23C 16/50* (2006.01)
*H01J 37/32* (2006.01)
*C23C 16/458* (2006.01)
*C23C 16/511* (2006.01)
*C23C 16/26* (2006.01)

(52) U.S. Cl.
CPC ...... *H01J 37/32678* (2013.01); *H01J 37/32192* (2013.01); *H01J 37/32733* (2013.01); *C23C 16/4584* (2013.01); *C23C 16/4582* (2013.01); *C23C 16/511* (2013.01); *C23C 16/26* (2013.01)
USPC ........ 427/575; 427/569; 427/571; 427/248.1; 427/249.1

(58) Field of Classification Search
USPC .......................... 427/569, 575, 722, 723 MW
See application file for complete search history.

(56) References Cited

U.S. PATENT DOCUMENTS

| | | | |
|---|---|---|---|
| 4,948,750 A | | 8/1990 | Kausche et al. |
| 5,180,948 A | * | 1/1993 | Heinemann et al. ..... 315/111.21 |

(Continued)

FOREIGN PATENT DOCUMENTS

| | | | |
|---|---|---|---|
| FR | 2658025 A1 | 8/1991 | |
| FR | 2797372 A | 2/2001 | |

(Continued)

OTHER PUBLICATIONS

International Search Report for PCT/FR2008/051824 dated May 6, 2009.

*Primary Examiner* — David Turocy
(74) *Attorney, Agent, or Firm* — Heslin Rothenberg Farley & Mesiti P.C.

(57) ABSTRACT

A method of treating a surface of at least one part by individual sources of an electron cyclotron resonance plasma is characterized by subjecting the part(s) to at least one movement of revolution with regard to at least one fixed linear row of elementary sources. The linear row or rows of elementary sources are disposed parallel to the axis or axes of revolution of the part or parts.

10 Claims, 5 Drawing Sheets

(56) References Cited

U.S. PATENT DOCUMENTS

| | | | |
|---|---|---|---|
| 5,378,284 A * | 1/1995 | Geisler et al. | 118/723 MR |
| 5,714,009 A * | 2/1998 | Boling | 118/723 MW |
| 5,879,519 A * | 3/1999 | Seeser et al. | 204/192.12 |
| 6,010,755 A | 1/2000 | Suzuki | |
| 6,407,359 B1 * | 6/2002 | Lagarde et al. | 219/121.43 |
| 2005/0001554 A1 | 1/2005 | Petrin et al. | |

FOREIGN PATENT DOCUMENTS

| | | |
|---|---|---|
| FR | 2826506 A1 | 12/2002 |
| FR | 2838020 A1 | 10/2003 |
| FR | 2895208 A | 6/2007 |
| WO | 2007/023350 A | 3/2007 |
| WO | WO 2007023350 A1 * | 3/2007 |

* cited by examiner

METHOD OF TREATING A SURFACE OF AT LEAST ONE PART BY MEANS OF INDIVIDUAL SOURCES OF AN ELECTRON CYCLOTRON RESONANCE PLASMA

CROSS REFERENCE TO RELATED APPLICATIONS

This application is a national stage filing under section 371 of International Application No. PCT/FR2008/051824 filed on Oct. 9, 2008, and published in French on Apr. 30, 2009 as WO 2009/053614 and claims priority of French application No. 0758368 filed on Oct. 16, 2007, the entire disclosure of these applications being hereby incorporated herein by reference.

BACKGROUND ART

The invention relates to the technical field of the production of plasma by electron cyclotron resonance (ECR) from a gaseous medium, and relates more particularly to a surface treatment.

In a manner perfectly known to a person skilled in the art, the plasma generated by electron cyclotron resonance can be used in the surface treatment of metal or other parts, such as the cleaning of the parts by ionic etching, ionic assistance to a PVD deposition process, the activation of gaseous species to make PACVD coatings, etc. These plasma surface treatment methods can be used, inter alia, in the field of mechanical engineering, optics, corrosion protection, or surface treatment for power generation.

The invention finds a particularly advantageous application in the treatment of one or more parts having multiple faces to be treated, or even shapes called complex shapes.

In a manner known per se, to carry out a plasma treatment on parts of complex shape, the said parts are polarized in continuous, pulsed or radiofrequency mode, in order to create a plasma directly at the surface of the parts to be treated. The drawback of this solution is that the production of plasma and the bombardment of the surface by the plasma ions are not independent, because the working voltage determines both the plasma density and the energy of the ions which reach the surface. It is also observed that this polarization is only effective at pressures of about 1 to 10 Pa. In fact, such a pressure, which is relatively high for a plasma treatment, corresponds to a short mean free path, making the transport of material from or to the parts to be treated particularly difficult, and promoting the formation of hollow cathodes between the parts, so that the treatment obtained is not uniform. To avoid the formation of hollow cathodes, it is necessary to closely monitor the distances between the parts to be treated.

Even when the working pressure is lowered by using an external source to create the plasma, for example radiofrequency waves or microwaves, the problem of the uniform treatment of the parts subsists.

Numerous technical solutions have been proposed to create a uniform plasma at the surface of the part(s) to be treated.

According to the teaching of patent FR 2 658 025, the uniform plasma is obtained by applying a uniform magnetic field in volume. The uniform treatment of the part therefore results from the homogeneity of the plasma. Moreover, this type of configuration is extremely limiting because parts of a ferromagnetic type necessarily modify the homogeneity of the magnetic field and, consequently, the uniformity of treatment.

Patent FR 2 838 020 proposes a distribution of sources on the periphery of a reactor to confine the plasma, so that it is uniform in volume, to obtain a uniform treatment. According to this solution, the magnetic or other nature of the parts is immaterial, but the homogeneity of the plasma is necessarily affected by the presence of the parts. In fact, the production of a plasma that is uniform in volume results from the sum of the contributions of the elementary sources distributed on the wall of the treatment system. The fact of placing an object in the plasma necessarily causes a shadowing of the sources, which is detrimental to the homogeneity of the plasma and the uniformity of treatment.

One solution for treating objects having a planar geometry or having a slightly curved surface geometry, appears from the teaching of patent FR 2 797 372. According to the teaching of this patent, the plasma sources are positioned at a constant distance from the surface of the parts to be treated, so that the plasma is uniform on this surface. However, as indicated, this solution is specific to the predetermined geometry of the parts. For each new geometry, it is necessary to modify the reactor and more particularly, the position of the plasma sources.

Another solution for treating objects having a planar geometry appears from the teaching of patent WO2007/023350. This patent uses an unusual magnetic induction resonance condition $B=\pi mf/e$ where f is the frequency of the electromagnetic wave and me and e are the mass and charge of the electron, respectively. According to the teaching of this patent, a uniform treatment zone is obtained by bringing the elementary sources sufficiently close together to obtain a common induction isosurface B which satisfies the above resonance condition. At the frequency of 2.45 GHz normally used, this condition is satisfied for a field of about 437 gauss. This solution accordingly requires the use of rather short distances between the elementary sources, less than 5 cm regardless of the pressure. It is therefore necessary to have many individual sources, thereby increasing the cost of treatment. Similarly, the magnetic field facing the sources is reinforced, which may be detrimental for treating magnetic parts.

Another solution appears from the teaching of patent FR 2 826 506, which relates to a device for amplifying the current of an abnormal electrical discharge. The device amplifies an existing plasma and therefore, to function, requires a combination with another electrode such as a magnetron cathode. The plasma is amplified by the application of a positive voltage. In fact, a highly positive plasma has the potential drawback of the sputtering of the reactor walls and, consequently, the contamination of the parts to be treated.

It is the object of the invention to remedy these drawbacks simply, safely, effectively and efficiently.

The problem that the invention proposes to solve is to carry out a surface treatment for treating parts of complex shape uniformly, in other words, for a uniform treatment in volume although the plasma itself is not uniform in volume, thereby limiting the number of individual sources and reducing the cost of the treatment.

BRIEF SUMMARY OF INVENTION

To solve such a problem, a method and a device have been designed and developed for the surface treatment of at least one part by means of elementary plasma sources by electron cyclotron resonance.

The method consists in subjecting the part(s) to at least one movement with regard to at least one fixed linear row of elementary sources.

The device comprises at least one fixed linear row of elementary sources disposed facing the part(s) subjected to means for being subjected to at least one movement of revolution.

In order to superimpose the plasmas of the elementary sources and give rise to a uniform treatment along the row of elementary sources, the linear row or rows of elementary sources is(are) disposed parallel to the axis of revolution of the part or parts.

In the case of the use of a plurality of linear rows, these rows are disposed so that they do not interfere magnetically with one another.

According to these features, the elementary plasma sources constitute a localized treatment zone, so that scaling up becomes extremely simple.

Advantageously, the movement of revolution is in the form of a single rotation or in the form of a planetary movement, single or double.

To satisfy the condition of electron cyclotron resonance, the elementary sources may consist of a coaxial waveguide and an end fitting containing a magnet determined to permit electron cyclotron resonance and adapted to the frequency of the generator(s) supplying the said sources, as described in patent FR 2 797 372.

To preserve the symmetry of revolution of the guide and to guarantee that the electron trajectories are closed upon themselves, the supply axis of the magnet is colinear with the axis of the waveguide.

According to another feature, the elementary sources may be supplied by a single generator of which the power is divided into equal parts between the sources as it appears from patent FR 2 798 552. The elementary sources may be supplied by generators of which the power is adjusted to have a uniform treatment along the row of the said sources.

The minimum distance between two sources is imposed by their magnetic interaction. It is about twice the diameter of the magnet of an elementary source. Below this, the interaction between magnets shifts the ECR zone. In the case of opposite polarities between the two magnets, the zone comes too close to the surface of the source; in the opposite case, it moves too far away from it.

From the surface of the source, the plasma spreads along a distance $Rmax_o$ of about 5 cm at a pressure $P_o$ of $2.10^{-3}$ mbar. The maximum spacing Dmax between two sources is therefore limited to twice this distance (about 10 cm). At lower pressure, the maximum spacing may be larger and, at higher pressure, it is lower. This distance is therefore inversely proportional to the pressure.

$$Dmax = 2Rmax_o \frac{P_o}{P}$$

BRIEF DESCRIPTION OF DRAWING FIGURES

The invention is described in greater detail below in conjunction with the figures of the appended drawings in which.

DETAILED DESCRIPTION

Figure 1:
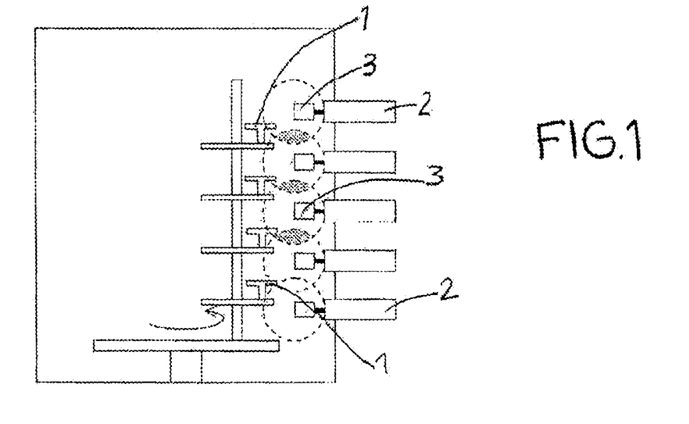
FIG. 1 is a purely schematic front view of a simplified embodiment of the treatment device according to the invention.

FIG. 1 shows the general structure of the device for the surface treatment of at least one part (1) by means of elementary plasma sources (2) by electron cyclotron resonance.

According to the invention, the device comprises at least one fixed linear row of elementary sources (2) disposed facing the part(s) (1).

Importantly, the part(s) (1) is (are) subjected to any type of known and appropriate means for being subjected to at least one movement, in particular a movement of revolution.

This combination of a movement of revolution of the parts with the linear arrangements of the elementary sources of plasma by electron cyclotron resonance, serves to produce a uniform treatment of the three-dimensional surfaces of the complex parts.

Figure 2:
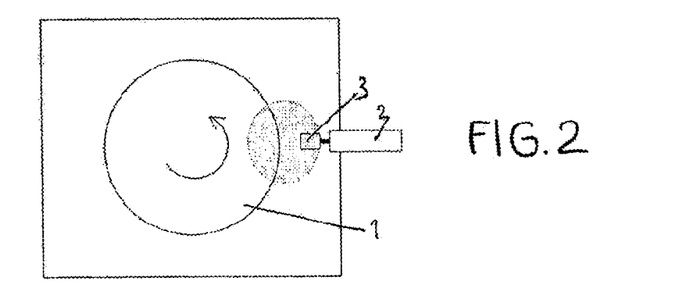
FIG. 2 is a plan view corresponding to FIG. 1 in the case in which the movement is of the revolution type, in the form of a simple rotation.

The movement is adapted to the size and geometry of the parts to be treated and to the loading of the vacuum chamber. For a large part (FIG. 2), this movement may consist of a simple rotation.

Figure 3:
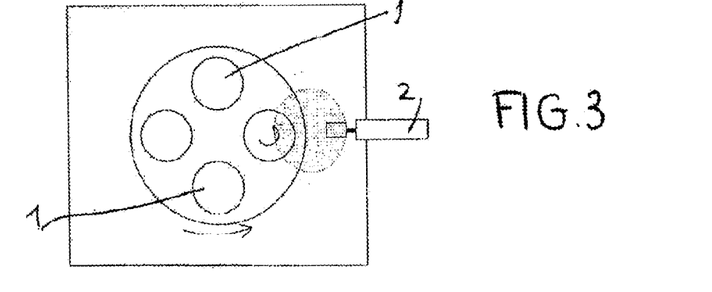
FIG. 3 is a view similar to FIG. 2 in the case in which the movement is of the revolution type, in the form of a single planetary movement.
Figure 4:
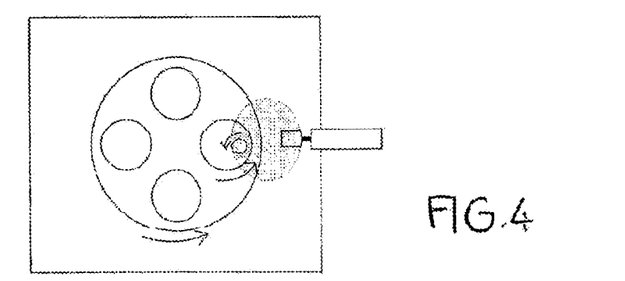
FIG. 4 is a view similar to FIG. 3 in the case in which the movement is of the revolution type, in the form of a double planetary movement.

For smaller parts, the movement may be of the single planetary type (FIG. 3) or of the double planetary type (FIG. 4).

Figure 7:
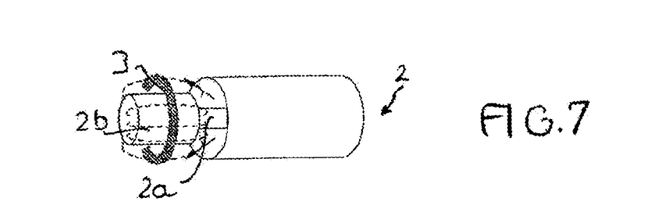
FIG. 7 is a perspective view of an exemplary embodiment of an elementary source

In one embodiment, each elementary source (2) consists of a coaxial waveguide (2a) and an end fitting (2b) containing a sufficiently powerful magnet (3) to obtain the electron cyclotron resonance. The supply axis of the magnet is colinear with the axis of the coaxial guide (2a). These arrangements serve to preserve the symmetry of revolution of the guide and to guarantee that the electron trajectories close upon themselves.

Figure 5:
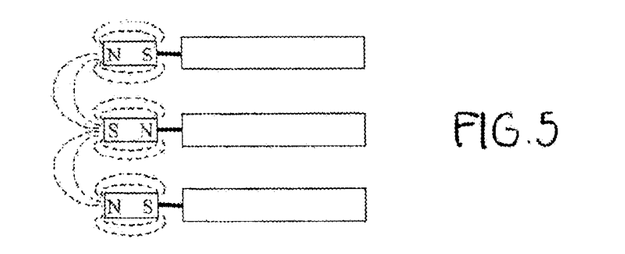
FIGS. 5 and 6 show two arrangements of elementary sources having a supply with different polarities (FIG. 5) or, preferably, the same polarities (FIG. 6)

The magnetization of the various sources (2) may be freely determined, so that adjacent sources can have the same polarity (FIG. 6) or different polarities (FIG. 5).

Figure 6:
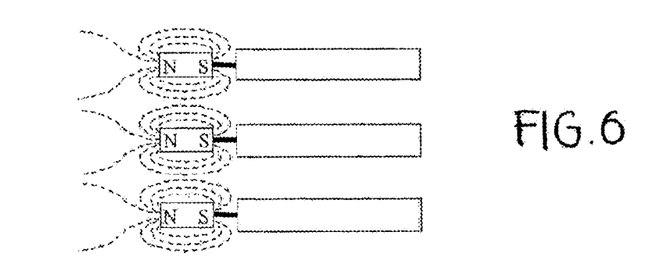

In the case in which the polarities of two neighbouring magnets are opposed, the field lines pass from the pole of one magnet to the opposite pole of the other magnet. Hot electrons are then trapped on its lines and make round trips between the two magnets. This localization of electrons occurs in the space in front of and between two sources and gives rise to a stronger plasma at this location. This results in a higher speed of deposition between two magnets. In the case in which the polarization of the sources is the same, the field lines of two neighbouring magnets repel each other and no line connects the two magnets. The localization of hot electrons in the space in front of and between the sources then does not take place and the deposition is more uniform. To recover an equivalent uniformity with alternate polarizations, the source-substrate distance can by increased by a few centimeters, but this causes a loss of the speed of deposition. For these reasons, the preferable arrangement of the magnets is that in which the polarity is the same everywhere.

Example 1

Incorrect: Static Deposition of Carbon by PACD

Figure 8A:
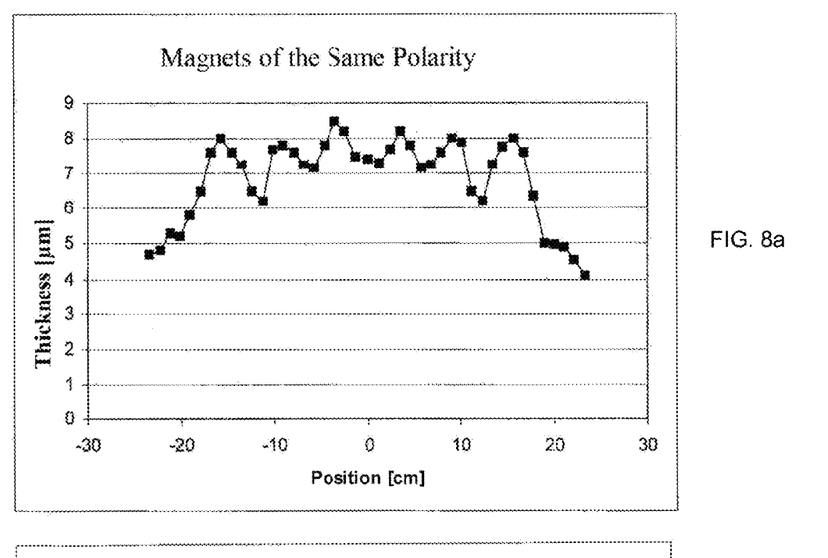
FIGS. 8a and 8b show thickness measurements from Example 1.
Figure 8B:
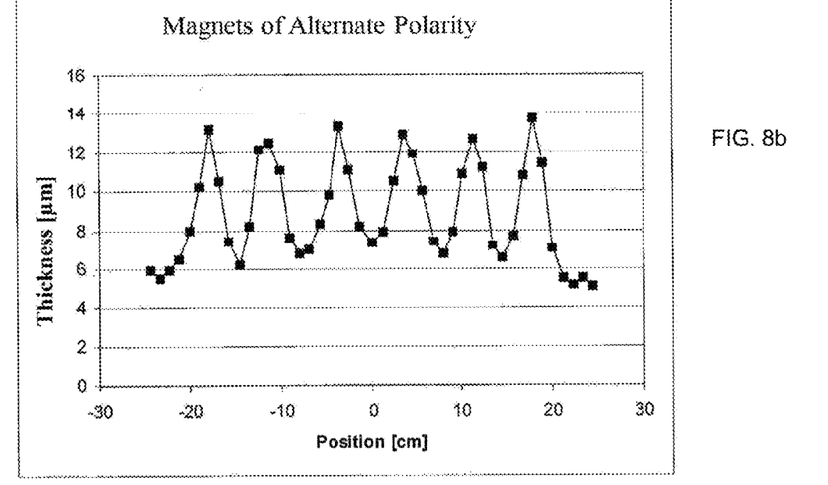

Two magnet polarity configurations were used: 6 end fittings having the same polarity and 6 end fittings with alternate polarity. The substrates are placed facing the sources and remain stationary during the treatment. FIGS. 8a and 8b show thickness measurements from Example 1.

The thickness measurements show that the static deposition is not uniform. The alternate polarity configuration yields a slightly better result but nevertheless has thickness variations of 30 to 40%.

Example 2

Figure 9A:
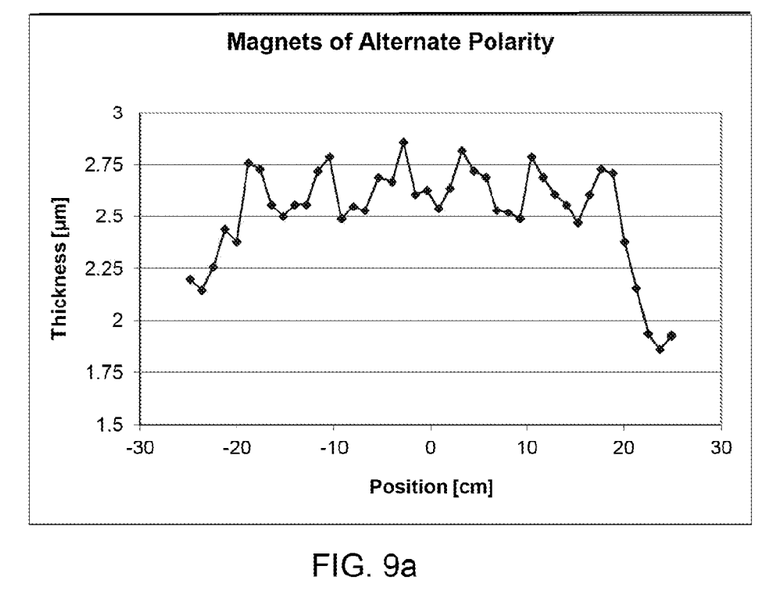
FIGS. 9a and 9b show thickness measurements from Example 2.
Figure 9B:
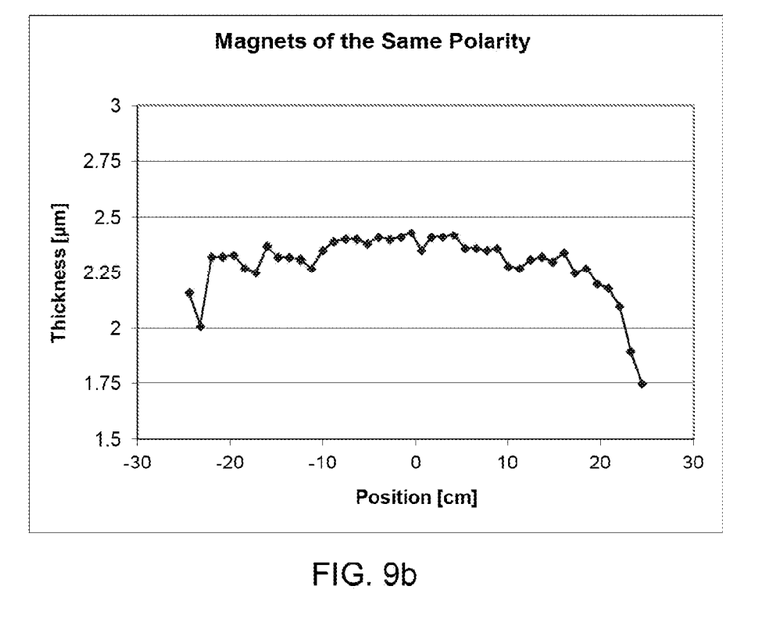

This deposition takes place using a hydrocarbon as precursor gas. Two configurations of the magnet polarities were used: 6 end fittings of the same polarity and 6 end fittings of alternate polarity. FIGS. 9a and 9b show thickness measurements from Example 2.

The deposit thickness measurements reveal two facts:

the average speed of deposition is higher in the configuration using magnets of alternate polarity;

the uniformity of deposition is better in the configuration using magnets of the same polarity;

These examples show that the association of a row of sources with a movement about an axis parallel to the row of sources yields a uniform treatment even if a static treatment yields a very non-uniform treatment.

The elementary sources (2) are supplied by a single generator, of which the power is divided into equal parts between the sources. If not, the elementary sources (2) are supplied by generators of which the power is adjusted to increase the degree of uniformity of treatment. The generator or generators are, for example, of the microwave type, typically with a capacity of 2.45 gigahertz.

According to the invention, as shown in FIG. 1, a plurality of sources (2) are disposed along a line parallel to the axis (X-X') of rotation of the parts. This causes the plasma zones of the elementary sources (2) to be superimposed, thereby obtaining a uniform treatment along the row of elementary sources.

The minimum distance Dmin between two sources is imposed by their magnetic interaction. It is about twice the diameter of the magnet of an elementary source. Below this, the interaction between magnets shifts the ECR zone. In the case of opposite polarities between the two magnets, the zone moves too close to the surface of the source; in the opposite case, it moves too far away from it.

From the surface of the source, the plasma spreads along a distance $Rmax_o$ of about 5 cm at a pressure $P_o$ of $2.10^{-3}$ mbar. The maximum spacing Dmax between two sources is therefore limited to twice this distance (about 10 cm). At lower pressure, the maximum spacing may be larger and, at higher pressure, it is lower. This distance is therefore inversely proportional to the pressure:

$$D\max = 2R\max_o \frac{P_o}{P}$$

To produce a uniform treatment along the height of the reactor, the relative position of the various sources must therefore be between Dmin and Dmax.

In an exemplary embodiment, the parts to be treated may be disposed on a substrate holder with rotation capacity according to one or more movements and of the type of those used in the field of PVD deposition such as magnetron sputtering. The minimum distance from the parts to the sources is defined as being the distance considered as close as possible during the movement. It has been found that a minimum distance of between 40 and about 160 mm yields an adequate treatment quality with regard to the desired uniformity.

Figure 10:
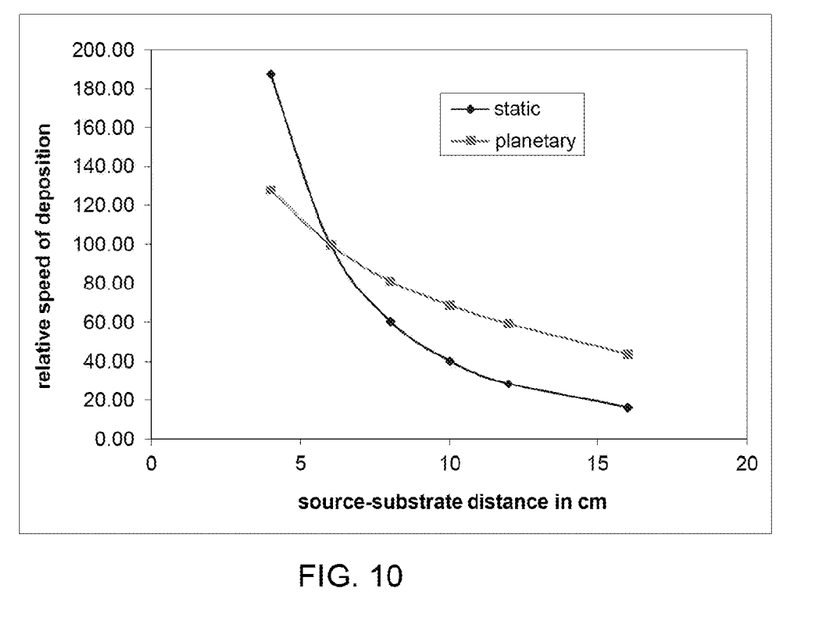
FIG. 10 shows the uniformity of thickness of a deposit produced from microwave ECR sources using a hydrocarbon as precursor gas.

FIG. 10 relates to the uniformity of thickness of a deposit produced from microwave ECR sources using a hydrocarbon as precursor gas. The specimens are placed at different minimum distances from the sources and opposite them. A static treatment, that is, with substrates remaining stationary, is compared with a treatment with a planetary movement. The figure shows the decrease in the speed of deposition when the distance to the row of sources increases. In the case of planetary movement, the source-substrate distance corresponds to the minimum distance from the substrate to the sources during the movement. This clearly shows that the movement serves to diminish the drop in the speed of deposition.

The invention finds an advantageous application for surface treatment at various levels, such as, in a non-limiting manner, the cleaning of parts by ionic etching, ionic assistance to a PVD deposition process, or the activation of gaseous species to produce PACVD coatings. As indicated in the introduction, these plasma treatment techniques are used in many fields, such as mechanical engineering, optics, corrosion protection, or surface treatment for power generation.

The advantages clearly appear from the description, and in particular, it is emphasized and recalled that the method and the device for treatment by means of elementary plasma sources by electron cyclotron resonance allows:

the treatment of metal or other parts, having a variable and random geometry, using a single equipment configuration;

uniform treatment on complex and varied surfaces, without necessarily requiring the modification of the geometry of the equipment according to the geometry of the parts.

The invention claimed is:

1. Method for treating a surface of at least one part having multiple faces with a non-uniform plasma generated with elementary plasma sources by distributed electron cyclotron resonance, comprising: subjecting the at least one part to at least one movement of revolution with regard to at least one fixed linear row of spaced apart elementary plasma sources, each source comprising a coaxial waveguide and an end fitting containing a magnet for electron cyclotron resonance, setting spacing between adjacent sources of the at least one fixed linear row between a minimum distance of about twice a diameter of the magnet, and a maximum distance Dmax determined by the formula:

$$D\max = 2R\max_o \frac{P_o}{P}$$

where: $R\max_o$ is about 5 cm, $P_o$ is $2.10^{-3}$ mbar, and P is working pressure in mbar, the at least one fixed linear row of elementary plasma sources being disposed parallel to an axis of revolution of the at least one part and providing uniform treatment in volume of the at least one part although the plasma itself is not uniform in volume, whereby uniform surface treatment on the multiple faces of the at least one part is realized without requiring modification of equipment geometry according to geometry of the at least one part.

2. The method according to claim 1, wherein the movement of revolution is a single rotation.

3. The method according to claim 1, wherein the movement of revolution is a single or double planetary movement.

4. The method according to claim 1, wherein adjacent elementary sources have a same polarity.

5. The method according to claim 1, wherein magnetisation axis of the magnet is colinear with an axis of the waveguide and preserves symmetry of revolution of said guide and guarantees that electron paths close upon themselves.

6. The method according to claim 1, wherein the elementary sources are supplied by a single generator having a power divided into equal parts between the sources.

7. The method according to claim 1, wherein the elementary sources are supplied by generators having a power that is adjusted to have a uniform treatment along the row of the said sources.

8. The method according to claim 1, wherein minimum distance from the sources to the at least one part is the closest distance during the movement and is between 40 and about 160 mm.

9. The method according to claim 1, wherein the at least one fixed linear row of spaced apart elementary plasma sources comprises at least three elementary plasma sources.

10. The method according to claim 1, wherein the at least one fixed linear row of spaced apart elementary plasma sources consists of a single row.

* * * * *